(12) United States Patent
Wang et al.

(10) Patent No.: US 10,681,811 B2
(45) Date of Patent: Jun. 9, 2020

(54) CONNECTING OPTICAL SUB-ASSEMBLY TO MAIN PRINTED CIRCUIT BOARD

(71) Applicants: Tongqing Wang, Newark, CA (US); Ming Ding, Bellevue, WA (US)

(72) Inventors: Tongqing Wang, Newark, CA (US); Ming Ding, Bellevue, WA (US)

(*) Notice: Subject to any disclaimer, the term of this patent is extended or adjusted under 35 U.S.C. 154(b) by 0 days.

(21) Appl. No.: 16/271,854

(22) Filed: Feb. 10, 2019

(65) Prior Publication Data
US 2019/0254165 A1   Aug. 15, 2019

Related U.S. Application Data

(60) Provisional application No. 62/710,272, filed on Feb. 15, 2018.

(51) Int. Cl.
H05K 1/00  (2006.01)
H05K 1/14  (2006.01)
H05K 1/02  (2006.01)
H05K 1/18  (2006.01)
H05K 1/03  (2006.01)

(52) U.S. Cl.
CPC .............. H05K 1/14 (2013.01); H05K 1/028 (2013.01); H05K 1/0306 (2013.01); H05K 1/181 (2013.01); H05K 2201/058 (2013.01); H05K 2201/10121 (2013.01)

(58) Field of Classification Search
USPC ........................................... 361/749
See application file for complete search history.

(56) References Cited

U.S. PATENT DOCUMENTS

| | | | | |
|---|---|---|---|---|
| 5,985,697 A | * | 11/1999 | Chaney | ................... H01L 23/32 257/718 |
| 2006/0202322 A1 | * | 9/2006 | Kariya | .............. H01L 23/49827 257/698 |
| 2017/0023752 A1 | * | 1/2017 | Isenhour | .............. G02B 6/4293 |

* cited by examiner

Primary Examiner — Andargie M Aychillhum

(57) ABSTRACT

Embodiments of present invention provide various device assemblies for digital communication. The device assemblies may include a main printed-circuit-board (PCB); and an OSA-on-daughter-board (OODB) directly connected to the main PCB. The OODB has an optical sub-assembly (OSA) wire-bonded onto a daughter PCB. In one embodiment, the daughter PCB includes a flexible printed-circuit (FPC) sheet connecting the OODB directly to the main PCB. In another embodiment, the main PCB includes a FPC sheet connecting the main PCB directly to the OODB. In one embodiment, the connection may be made through an anisotropic conductive film or an anisotropic conductive adhesive.

19 Claims, 4 Drawing Sheets

CONNECTING OPTICAL SUB-ASSEMBLY TO MAIN PRINTED CIRCUIT BOARD

CROSS REFERENCE TO RELATED APPLICATION

The present application claims benefit of priority to a provisional U.S. patent application Ser. 62/710,272, filed Feb. 15, 2018, the content of which is incorporated herewith by reference in its entirety.

FIELD OF THE INVENTION

The present invention relates generally to high speed digital signal communication, and in particular relates to method of connecting an optical sub-assembly to a main printed circuit board, and device assemblies associated therewith.

BACKGROUND

Over the last decade, baud rate of digital optical signal in data communication has seen dramatic increase from around 10 Gbaud, to 28 Gbaud, and to 56 Gbaud. Not surprisingly, even higher baud rates are forth coming. Optical data communication involves electro-optic signal conversion. However, one of the main challenges facing this ever increasing baud rate is how to effectively and efficiently handle signal connection between an optical sub-assembly (OSA), which houses various modules that handle electro-optic signal conversion, and a main printed circuit board (PCB) which handles digital signal processing in the electrical domain.

The OSA provides optical to electrical (O/E) and/or electrical to optical (E/O) signal conversion, which are generally referred to as O/E or E/O conversion within the industry. For example, an OSA that handles electrical to optical signal conversion is generally referred to as a transmitter OSA (TOSA) while an OSA that handles optical to electrical signal conversion is generally referred to as a receiver OSA (ROSA). Both TOSA and ROSA are key components or sub-assemblies inside an optical transceiver that is widely used in equipment of data center and telecommunication service provider's network system. Optical transceivers that adopt small form factor (SFF) are a cornerstone of modern data centers. SFF may include, for example, SFP, QSFP, and OSFP.

An OSA (TOSA and ROSA) typically includes components such as laser diode (LD), photo detector (PD), planar lightwave circuits (PLC) and/or free-space based optical mux/demux, and electronic integrated circuits (IC's), such as laser driver, trans-impedance amplifier (TIA), and so on. As is simplistically illustrated in FIG. 7(a), and according to current art, a TO-CAN or box-based OSA 11 generally includes one or more of the above components contained in its own package, which is connected to an outside main PCB 10 through two transitional connections 13 and 14. A first transitional connection 13 is made from the OSA 11 to a flexible printed circuit (FPC) 12. The FPC 12 is then connected to the main PCB 10 through a second transitional connection 14. In other words, a FPC is used as a transitional medium to interconnect the OSA 11 with the main PCB 10. The two connections 13 and 14 made at the OSA end and the main PCB end are commonly through soldering or epoxy. Being a separated part both to the OSA and to the main PCB, the FPC provides a flexible connection between OSA 11 and main PCB 10. The use of a separate FPC is important in order to increase product yield and reliability that are often associated with the mechanical manufacturing tolerance of each components.

On the other hand, with the baud rate of digital data transmission going above 20 Gbaud, the effect of signal degradation caused by the two transitional connections 13 and 14 (between the OSA and the FPC and between the FPC and the main PCB) becomes more and more critical and sometimes becomes simply intolerable by the system. For example, for baud rate of digital signal of data transmission that is 50 Gbaud and beyond, due to manufacturing limitation in precision tolerance of the OSA, FPC, and PCB modules, and their assembly through soldering, impact on signal degradation brought upon by the above interconnect approach are so significant that they can no longer be ignored.

To mitigate the above concerns of signal degradation, so far the direction of industry is heading toward soldering (or through the use of epoxy) the OSA directly onto the main PCB, bypassing the use of the traditional FPC as a transitional medium, as is simplistically illustrated in FIG. 7(b). Under this situation, electrical signals associated with the OSA 21 are connected through wire bonding 22 directly to the main PCB 20. However, this approach comes with the disadvantage that after the OSA-PCB assembly is finished, the OSA 21 can no longer be easily removed from the main PCB 20 for rework or repair, particularly after the encapsulation 23 is added onto the OSA portion 21 in order to protect bonding wire 22 and prevent humidity effect. Consequently, this approach of directly wire-bonding OSA module onto main PCB brings with it significant impact on the overall production yield.

SUMMARY

Embodiment of present invention provides a device assembly. The device assembly includes a main printed-circuit-board (PCB); and an OSA-on-daughter-board (OODB) which includes an optical sub-assembly (OSA) mounted on a daughter PCB, with the OODB being directly connected to the main PCB, wherein the main PCB includes a flexible printed-circuit (FPC) sheet, and the OODB is directly connected to the main PCB at the FPC sheet.

In one embodiment, the FPC sheet of the main PCB is conductively connected to the daughter PCB of the OODB through a bonding agent, the bonding agent providing a plurality of conductive paths between the FPC sheet and the daughter PCB in a first direction and electrical isolation among the plurality of conductive paths in a second direction that is perpendicular to the first direction.

In a further embodiment, the plurality of conductive paths are arranged in an M-by-N array with both M and N being larger than 1, and wherein the FPC sheet includes a corresponding M-by-N array of connecting points.

In another embodiment, the FPC sheet of the main PCB is conductively connected to the daughter PCB of the OODB through soldering or epoxy.

In one embodiment, the daughter PCB is built from a ceramic substrate and the OSA is mounted on top of the ceramic substrate and enclosed in a hermetic package.

In a further embodiment, the OSA is attached to the daughter PCB inside the hermetic package, and is conductively wire-bonded to the daughter PCB.

In a further embodiment, a top surface area of the daughter PCB is less than 30 mm^2 and the hermetic package has a footprint occupying larger than 80% of the top surface area of the daughter PCB.

In a yet further embodiment, the daughter PCB extends from inside of the hermetic package to outside thereof, and the FPC sheet being conductively connected to the daughter PCB outside the hermetic package.

In one embodiment, the FPC sheet is built into the main PCB at a first location, during manufacturing thereof, and conductively connected to the daughter PCB of the OODB at a second location, and FPC sheet has a length no longer than 5 mm from the first location to the second location.

Embodiment of present invention further provides a device assembly. The device assembly includes an OSA-on-daughter-board (OODB) having an optical sub-assembly (OSA) wire-bonded onto a daughter printed-circuit-board (PCB); and a main PCB directly connected to the OODB, wherein the daughter PCB of the OODB includes a flexible printed-circuit (FPC) sheet and the main PCB is directly connected to the OODB at the FPC sheet of the daughter PCB.

Embodiment of present invention further provides a device assembly. The device assembly includes a main printed-circuit-board (PCB); and an OSA-on-daughter-board (OODB) having an optical sub-assembly (OSA) conductively mounted to a daughter PCB, wherein the main PCB is directly connected to the OODB through a bonding agent, the bonding agent providing a plurality of conductive paths between the main PCB and the OODB in a first direction, and electrical isolation among the plurality of conductive paths in a second direction that is perpendicular to the first direction.

In one embodiment, the daughter PCB of the OODB includes a flexible printed-circuit (FPC) sheet, the FPC sheet is conductively connected to the main PCB through the bonding agent, and the bonding agent is either an anisotropic conductive film (ACF) or an anisotropic conductive adhesive (ACA).

BRIEF DESCRIPTION OF THE DRAWINGS

The present invention will be understood and appreciated more fully from the following detailed description of embodiments of the invention, taken in conjunction with accompanying drawings of which.

Figure 1:
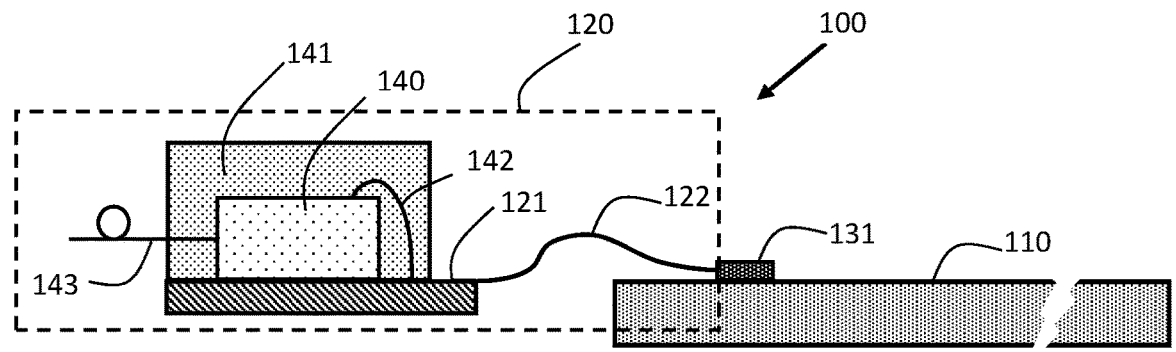
FIG. 1 is a demonstrative illustration of connecting an OSA-on-daughter-board with a main PCB board according to one embodiment of present invention.

It will be appreciated that for simplicity and clarity purpose, elements shown in the drawings have not necessarily been drawn to scale. Further, in various functional block diagrams, two connected devices and/or elements may not necessarily be illustrated to be connected, for example, by a continuous solid line or dashed line but rather sometimes a small gap between two lines extended from the two devices and/or elements may be inserted intentionally in order to illustrate the individual devices and/or elements even though their connection is implied. In some other instances, grouping of certain elements in a functional block diagram may be solely for the purpose of description and may not necessarily imply that they are in a single physical entity or they are embodied in a single physical entity.

DETAILED DESCRIPTION OF PREFERRED EMBODIMENTS

Embodiments of present invention provides unique and cost-effective approach, and related device assemblies, which help interconnect OSA with main PCB board, reducing signal degradation associated therewith, and improve overall production yield.

FIG. 1 is a demonstrative illustration of connecting an OSA-on-daughter-board with a main PCB board, and a device assembly associated therewith, according to one embodiment of present invention. More specifically, device assembly 100 may include a main PCB or main PCB board 110 and an OSA-on-daughter-board (OODB) 120 that is directly connected to main PCB board 110. OODB 120 provided by embodiment of present invention may include an OSA 140 attached to a daughter printed-circuit-board or daughter PCB 121. Daughter PCB 121, referred to herein as daughter-board as well, may further include a flexible printed circuit (FPC) sheet 122. As part of daughter PCB 121, FPC sheet 122 connects OSA 140 to main PCB 110 through, for example, soldering or epoxy 131 although other method of connecting FPC sheet 122 to main PCB 110 are fully contemplated here as well, such as that described below in connection with drawing FIG. 4. FPC sheet 122 may be built as part of daughter PCB 121 during manufacturing thereof, thus be part of OODB 120, and has a very short length but sufficiently long to connect to main PCB 110. For example, length of FPC sheet 122 may be less than 10 mm and preferably less than 5 mm. With such a short FPC sheet length, OODB 120 may optionally be mechanically but removably mounted on main PCB 110, close to connection point 131. FPC sheet 122 may extend from a top or bottom surface of daughter PCB 121 at an edge of daughter PCB 121. The use of a FPC sheet 122 that is built together with and into daughter PCB 121 helps eliminate the transitional connection which would otherwise be needed between OSA 140 and FPC sheet 122, as those commonly exist in prior art that have been found causing signal degradation.

According to one embodiment of present invention, because FPC sheet 122 is built as a part of daughter PCB 121, various circuits on FPC sheet 122 and daughter PCB 121 may be integrated together during a manufacturing process of daughter PCB 121. Thereafter, OSA 140 may be attached and/or connected to daughter PCB 121 with current chip-on-board technology and through, for example, wire-bonding 142. For strength and performance stability, OSA 140 may further be encapsulated onto daughter PCB 121 by applying any suitable encapsulation material 141 that encompasses OSA 140 and wire-bonding 142. OODB 120 may further include an optical input/output interface 143 such as a pigtail fiber, a connector or receptacle, or an optical window for free-space connection.

Subsequently, OSA 140 and daughter PCB 121, which together form OODB 120, may be connected to main PCB 110 through soldering or epoxy 131. According to one embodiment of present invention, by connecting OSA 140 to main PCB 110 through the modularized OODB form, it not only eliminates one transitional connection, as described above, but also provides the ease for removing OSA 140 from main PCB 110, should such a need ever arise in future such as for repairing and/or replacement purpose, by simply detaching FPC sheet 122 from main PCB 110. More importantly, by virtue of the elimination of one transitional connection between OSA 140 and FPC sheet 122, as afforded by embodiment of present invention, performance and manufacturing yield of the associated device assembly 100 may be improved. Both OODB 120 and main PCB 110 may be reworked and/or repaired separately.

According to one embodiment of present invention, dimensions of daughter PCB 121 may be made substantially small both in length and in width, and the same may be said for the footprint of the OSA 140. According to one embodiment, an overall dimension (length, width, height) of OODB 120, excluding the size of FPC sheet 122, may be made less than 10 mm in all directions, and potentially less than 5 mm, which is critical in enabling compact assembly while eliminating one of the transitional connection.

OSA-on-daughter-board 120 may be made to operate at a data rate of at least 20 Gbaud or above. The OSA 140 may be directly attached to daughter PCB 121 with good heat transfer. The heat transfer from OSA 140 related parts to daughter PCB 121 may be achieved by thermal vias. The mounting of daughter PCB 121 on main PBC 110 may either be electrically conductive or isolated depending upon need and application. FPC sheet 122 may extends out from a top surface, as demonstratively illustrated in FIG. 1, a bottom surface, or any middle layer or layers of daughter PCB 121. For better reliability and strength enhancement purpose, epoxy may be optionally added at the edge location of daughter PCB 121 to secure FPC sheet 122 that extends out from the edge area of daughter PCB 121.

Figure 2:
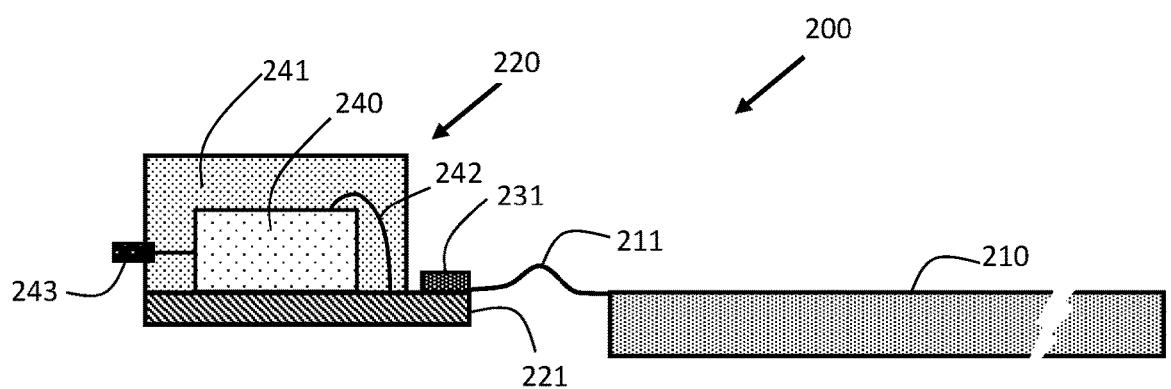
FIG. 2 is a demonstrative illustration of connecting an OSA-on-daughter-board with a main PCB board according to another embodiment of present invention.

FIG. 2 is a demonstrative illustration of connecting an OSA-on-daughter-board with a main PCB board, and a device assembly associated therewith, according to another embodiment of present invention. Device assembly 200 may include OODB 220 and main PCB 210 that is directly connected to OODB 220. Comparing with the connection between OODB 120 and main PCB 110 of device assembly 100 illustrated in FIG. 1, the connection here between OODB 220 and main PCB 210 is made at a FPC sheet 211 that is part of main PCB 210, instead of part of OODB 220. FPC sheet 211 of main PCB 210 may has a very short length but sufficiently long to connect to OODB 220 at a connection pad. For example, length of FPC sheet 211 may be less than 10 mm and preferably less than 5 mm. With such a short FPC sheet length, OODB 220 may optionally be mechanically but removably mounted on main PCB 210, close to where FPC sheet 211 extends from. For example, FPC sheet 211 may extend possibly from an edge of main PCB 210, or anywhere in the main PCB 210. Circuits on FPC sheet 211 and main PCB 210 may be built and integrated together during the manufacturing process of main PCB 210.

Similar to OODB 120 in device assembly 100, OODB 220 may include an OSA 240 attached to a daughter board or daughter PCB 221. FPC sheet 211 may be attached or conductively connected to daughter PCB 221 through soldering or epoxy 231. OSA 240 may be electronically connected to daughter PCB 221 via wire-bonding 242, and strength enhanced through encapsulation or encapsulation material 241. In FIG. 2, OSA 240 is demonstratively illustrated to possibly include an optical connector and/or receptacle 243, different from the optical interface of fiber pigtail 143 for OSA 140 in OODB 120 illustrated in FIG. 1.

Figure 3:
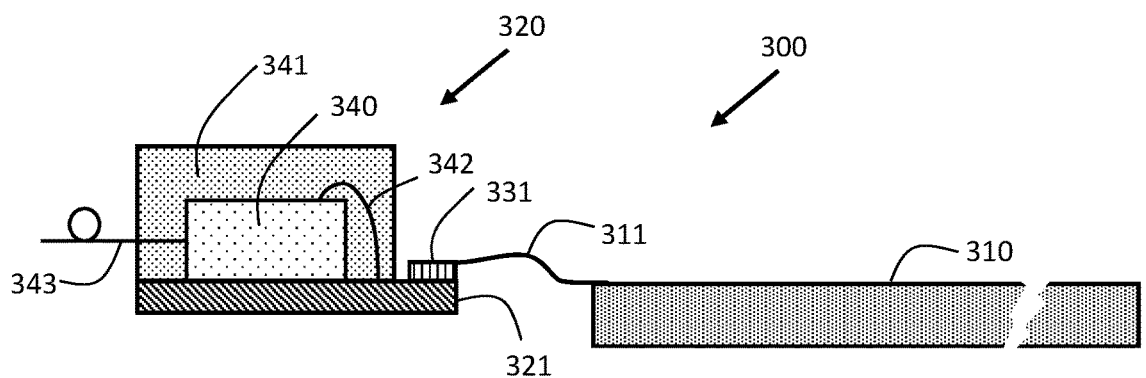
FIG. 3 is a demonstrative illustration of connecting an OSA-on-daughter-board with a main PCB board according to yet another embodiment of present invention.

FIG. 3 is a demonstrative illustration of connecting an OSA-on-daughter-board with a main PCB board, and a device assembly associated therewith, according to yet another embodiment of present invention. Optical transceivers with small form factor (SFF), which may include for example SFP, QSFP, and OSFP, require compact OSA (TOSA and ROSA) as well as fine pitch connection between the OSA and the main PCB. To address this industrial requirement and according to one embodiment of present invention, device assembly 300 as illustrated in FIG. 3 includes an OODB 320 and a main PCB 310 that is directly connected to OODB 320 at a FPC sheet 311 of main PCB 310. To achieve fine pitch connection between OODB 320 and main PCB 310, device assembly 300 applies an anisotropic conductive film (ACF) 331 or anisotropic conductive adhesive (ACA) to attach FPC sheet 311 to OODB 320. As being further detailed in connection with the description of drawing FIG. 6 below about ACF/ACA, the use of ACF 331 not only makes the electrical and mechanical connections from FPC 311 to daughter board or daughter PCB 320 of OODB 320 possible, but also provide well-controlled high frequency performance for pitches that may be as small as 0.2 mm. This fine pitch connection is benefited directly from the manufacturing ability to precisely control the volume and density of particles of the ACF and/or ACA material. According to embodiment of present invention, the adoption of use of ACF/ACA material for connecting a FPC sheet to a PCB (main PCB or daughter PCB) enables building future generation of optical transceiver modules that conform to SFF standard such as SFP, SFP-DD, QSFP, QSFP-DD, and OSFP. A unique feature provided by the ACF and/or ACA material is their ability to provide electrical connection through multiple conductive paths in a first direction (e.g., vertical direction) while in the meantime provide total electrical insulation among the multiple conductive paths in a second direction (e.g., horizontal direction) that is perpendicular to the first direction.

The rest of device assembly 300 may be similar to that of device assembly 200. For example, OODB 320 of device assembly 300 may include an OSA 340 that is on top of a daughter board or daughter PCB 321 and conductively connected to daughter board 321 through wire-bonding 342 or other currently available or future developed means. Encapsulation 341 may be made to strength OODB or OODB module 320 by applying encapsulating material 341 over OSA 340 and wire-bonding 342. OODB 320 may have an appropriate optical interface such as, for example, a pigtail fiber 343.

Figure 4:
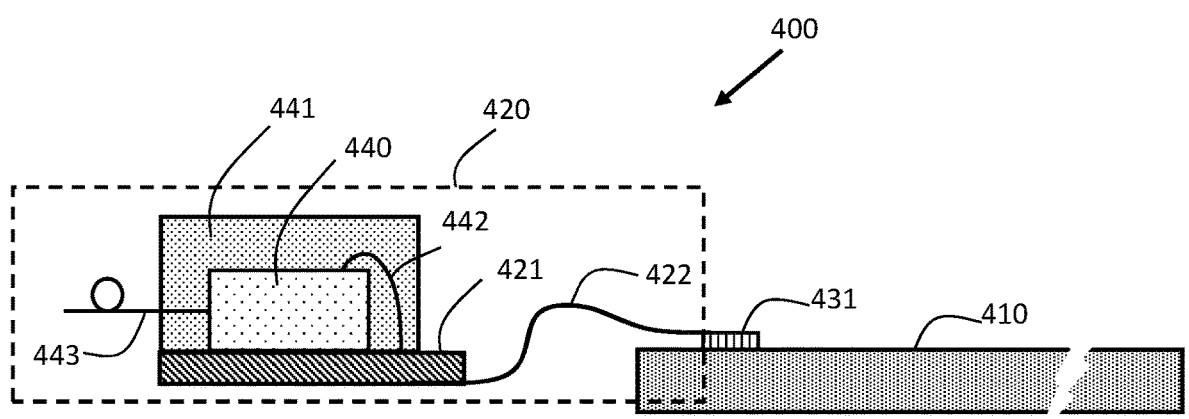
FIG. 4 is a demonstrative illustration of connecting an OSA-on-daughter-board with a main PCB board according to a further embodiment of present invention.

FIG. 4 is a demonstrative illustration of connecting an OSA-on-daughter-board with a main PCB board, and a device assembly associated therewith, according to a further embodiment of present invention. To the most part, device assembly 400 may be similar to device assembly 100 in that device assembly may include an OODB or OODB module 420 connected directly to a main PCB 410. OODB 420 may include an OSA 440 on top of a daughter board or daughter PCB 421 with wire-bonding 442 connected therewith, and OODB module 420 may be strength enhanced by encapsulation 441, which to certain extent may provide the effect of hermetical sealing for OSA 440 as well. On the other hand as being different from OODB 120 illustrated in FIG. 1, OODB 420 may have a FPC sheet 422 which extends from a lower part of daughter board 421 such as, for example, from a bottom surface of daughter board 421, as opposed from a top surface of daughter board 121 as in OODB 120 illustrated in FIG. 1. In fact, FPC sheet 422 may be designed and manufactured to come out of any particular point, layer, or layers of the multi-layer daughter board or daughter PCB 421 depending on particular circuit designs of the daughter board 421 and FPC sheet 422.

Also different from device assembly 100 but similar to device assembly 300, FPC sheet 422 of OODB 420 may be connected to main PCB 410, at any suitable location, through the use of ACF or ACA material 431. According to one embodiment of present invention, ACF or ACA connection 431 provides a plurality of substantially vertical conductive paths but the plurality of vertical conductive paths are mutually electrically isolated in a direction perpendicular to the conductive paths, i.e., a horizontal direction which enables compact connections with fine pitch.

Figure 5:
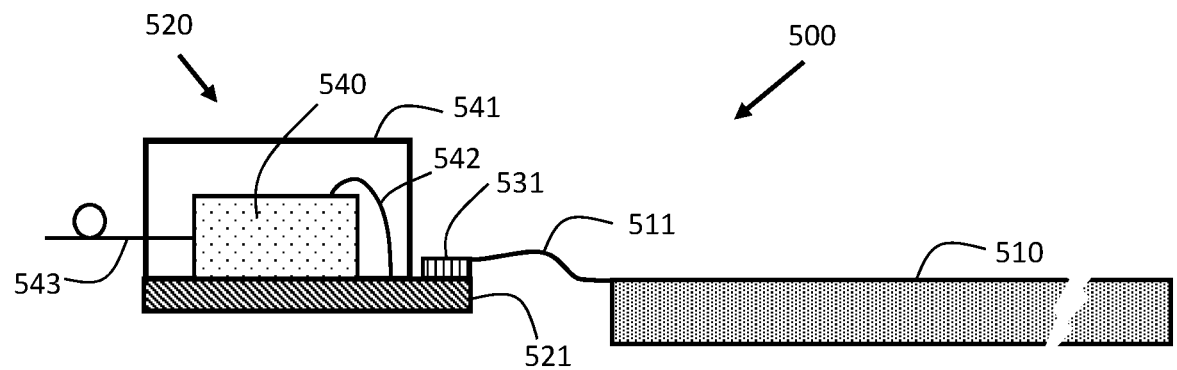
FIG. 5 is a demonstrative illustration of connecting an OSA-on-daughter-board with a main PCB board according to yet a further embodiment of present invention.

FIG. 5 is a demonstrative illustration of connecting an OSA-on-daughter-board with a main PCB board, and a device assembly associated therewith, according to yet a further embodiment of present invention. Similar to device assembly 300 illustrated in FIG. 3, device assembly 500 may have an OODB 520 directly connected to a main PCB 510 via a FPC sheet 511 which could either be part of main PCB 510, as illustrated in FIG. 5, or part of a daughter board or daughter PCB 521 of OODB 520. For example, according to one embodiment, OODB 520 may include an OSA 540 situated on top of and attached, via wire-bonding 542, to daughter PCB 521. Daughter PCB 521 may be made from fiberglass substrate, organic substrate, ceramic substrate, or any kind of substrate which may be able to accommodate operation of digital signal at a data rate of 20 Gbaud or above. According to one embodiment of present invention, OSA 540 may be attached onto daughter board 521 of a ceramic material, and may be hermetically sealed through packaging 541, as shown in FIG. 5, such that it may be free from exterior moisture which would, otherwise, affect reliability and performance of device assembly 500. Direct connection between main PCB 510 and OODB 520 may be made at FPC sheet 511 through the use of ACF or ACA 531, or otherwise through soldering, epoxy, or other means. OODB 520 may have an optical interface 543 such as a pigtail fiber, an optical connector or receptacle, or even an optical window providing optical access to OSA 540.

Figure 6:
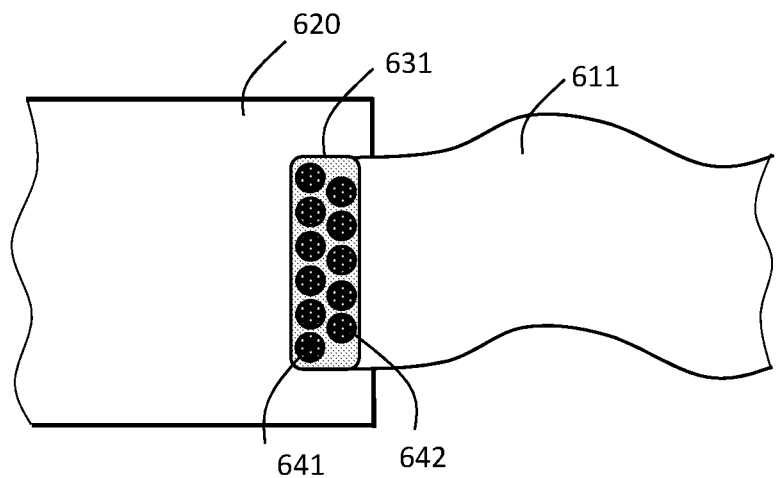
FIG. 6 is a demonstrative illustration of connecting a FPC to a main PCB or a daughter board according to one embodiment of present invention.
Figure 7A:
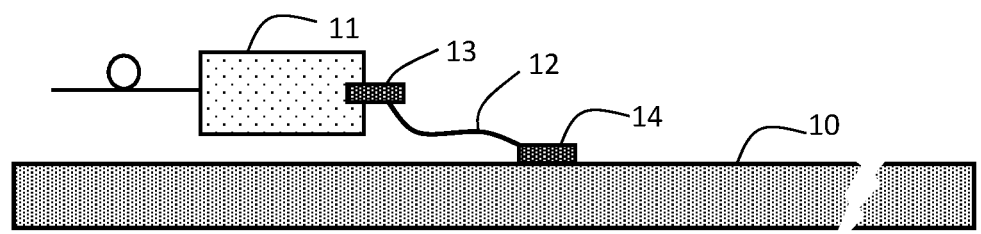
FIG. 7(a) and FIG. 7(b) are simplistic illustration of method of connecting an OSA module to a main PCB board as known in the art.
Figure 7B:
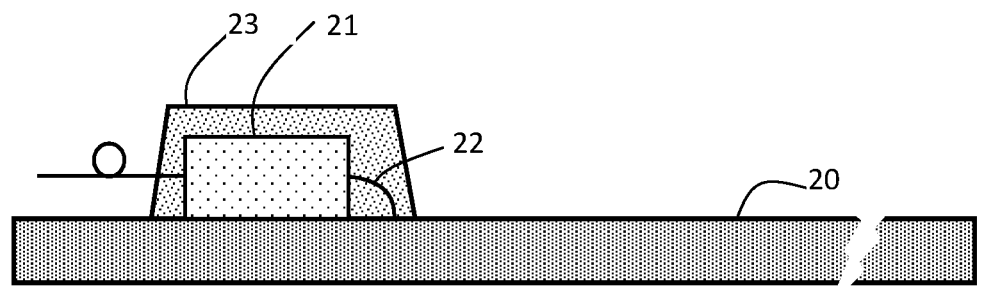

FIG. 6 is a demonstrative illustration of connecting a FPC sheet to a main PCB or a daughter PCB according to one embodiment of present invention. As being described above with regard to device assemblies 300, 400, and 500 in connection with the description of drawings FIGS. 3, 4, and 5, anisotropic conductive film (ACF) 331 or anisotropic conductive adhesive (ACA) may be used to attach a flexible printed circuit (FPC) sheet with either a main PCB or a daughter PCB of an OSA-on-daughter board (OODB) for compact and fine pitch electrical connection. For example, as illustrated in FIG. 6, a FPC sheet 611 may be connected to a main PCB or daughter PCB 620 through ACF or ACA 631. According to one embodiment of present invention, ACF or ACA 631 may include or be able to provide an M-by-N array of vertical conductive paths, represented illustratively by the arrays of "black" dots 641 and 642 in FIG. 6 for example, enabling multi-path electrical connection between FPC sheet 611 and PCB 620.

In one embodiment, either M or N may be equal to 1 and ACF/ACA 631 provides one row of conductive paths. In another embodiment, both M and N may be larger than 1, providing a two-dimensional array of conductive paths for connecting a FPC sheet with a PCB board. According to one embodiment of present invention, FPC sheet 611 may include a set of connecting points or connection lines that corresponds to the M-by-N array of conductive paths 631. In other words, FPC sheet 611 may also include an M-by-N array of connecting points. The multiple conductive paths may be straightly aligned (i.e., aligned in straight lines, both vertically and horizontally) or aligned in a triangular-shaped form such as being demonstratively illustrated in FIG. 6, and are mutually electrically isolated. Electrical isolation among the conductive paths makes it possible of making compact connection, which in-turn enables the making of future compact transceiver modules.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A device assembly comprising:
a main printed-circuit-board (PCB); and
an OSA-on-daughter-board (OODB) having an optical sub-assembly (OSA) mounted on a daughter PCB, the OODB being directly connected to the main PCB,
wherein the main PCB includes a flexible printed-circuit (FPC) sheet, and the OODB is directly connected to the main PCB at the FPC sheet, and
wherein the FPC sheet of the main PCB is conductively connected to the daughter PCB of the OODB through a bonding agent, the bonding agent providing a plurality of conductive paths between the FPC sheet and the daughter PCB in a first direction, and electrical isolation among the plurality of conductive paths in a second direction that is perpendicular to the first direction.

2. The device assembly of claim 1, wherein the plurality of conductive paths are arranged in an M-by-N array with both M and N being larger than 1, and wherein the FPC sheet includes a corresponding M-by-N array of connecting points.

3. The device assembly of claim 1, wherein the FPC sheet of the main PCB is conductively connected to the daughter PCB of the OODB through soldering or epoxy.

4. The device assembly of claim 1, wherein the daughter PCB is built from a ceramic substrate and the OSA is mounted on top of the ceramic substrate and enclosed in a hermetic package.

5. The device assembly of claim 4, wherein the OSA is attached to the daughter PCB inside the hermetic package, and is conductively wire-bonded to the daughter PCB.

6. The device assembly of claim 5, wherein a top surface area of the daughter PCB is less than 30 mm^2 and the hermetic package has a footprint occupying larger than 80% of the top surface area of the daughter PCB.

7. The device assembly of claim 6, wherein the daughter PCB extends from inside of the hermetic package to outside thereof, and the FPC sheet being conductively connected to the daughter PCB outside the hermetic package.

8. The device assembly of claim 1, wherein the FPC sheet is built into the main PCB at a first location, during manufacturing thereof, and conductively connected to the daughter PCB of the OODB at a second location, and FPC sheet has a length no longer than 5 mm from the first location to the second location.

9. A device assembly for digital communication, the device assembly comprising:
an OSA-on-daughter-board (OODB) having an optical sub-assembly (OSA) wire-bonded onto a daughter printed-circuit-board (PCB); and a main PCB directly connected to the OODB,
wherein the daughter PCB of the OODB includes a flexible printed-circuit (FPC) sheet and the main PCB is directly connected to the OODB at the FPC sheet of the daughter PCB, and wherein the FPC extends from a vertical edge of the daughter PCB.

10. The device assembly of claim 9, wherein the OSA is encapsulated onto the daughter PCB by an epoxy, and wherein the FPC sheet is built into the daughter PCB, and extends directly from the daughter PCB with no connection pad in-between.

11. The device assembly of claim 9, wherein the FPC sheet of the daughter PCB is conductively connected to the main PCB through a bonding agent, the bonding agent providing a plurality of conductive paths between the FPC sheet and the main PCB in a first direction, and electrical isolation among the plurality of conductive paths in a second direction perpendicular to the first direction.

12. The device assembly of claim 11, wherein the plurality of conductive paths are arranged in an M-by-N array with both M and N being larger than 1, and wherein the FPC sheet has a set of connecting points corresponding to the M-by-N array.

13. A device assembly for digital communication, the device assembly comprising:
a main printed-circuit-board (PCB); and
an OSA-on-daughter-board (OODB) having an optical sub-assembly (OSA) conductively mounted to a daughter PCB,
wherein the main PCB is directly connected to the OODB through a bonding agent, the bonding agent providing a plurality of conductive paths between the main PCB and the OODB in a first direction, and electrical isolation among the plurality of conductive paths in a second direction that is perpendicular to the first direction.

14. The device assembly of claim 13, wherein the main PCB comprises a flexible printed-circuit (FPC) sheet that extends directly from the main PCB without connection pad, the FPC sheet is conductively connected to the daughter PCB of the OODB, the daughter PCB is built from a ceramic substrate, and the OSA mounted on the daughter PCB is enclosed in a hermetic package on top of the ceramic substrate.

15. The device assembly of claim 14, wherein the plurality of conductive paths provided by the bonding agent are arranged in an M-by-N array with both M and N being larger than 1, and wherein the FPC sheet has a corresponding M-by-N array of connecting points.

16. The device assembly of claim 15, wherein a top surface area of the daughter PCB is less than 30 mm^2 and the hermetic package has a footprint occupying more than 80% of the top surface area of the daughter PCB.

17. The device assembly of claim 13, wherein the daughter PCB of the OODB comprises a flexible printed-circuit (FPC) sheet that extends directly from the daughter PCB at a vertical edge thereof, the FPC sheet being conductively connected to the main PCB through the bonding agent, the bonding agent being an anisotropic conductive film (ACF) or an anisotropic conductive adhesive (ACA).

18. The device assembly of claim 17, wherein the FPC sheet extends from a top surface or a bottom surface of the daughter PCB at an edge thereof.

19. The device assembly of claim 18, wherein the FPC sheet has a length no more than 5 mm.

* * * * *